(12) United States Patent
Lee et al.

(10) Patent No.: US 9,786,801 B2
(45) Date of Patent: Oct. 10, 2017

(54) ATOMIC LAYER JUNCTION OXIDE AND PREPARING METHOD THEREOF

(71) Applicant: RESEARCH & BUSINESS FOUNDATION SUNGKYUNKWAN UNIVERSITY, Suwon-si (KR)

(72) Inventors: Jaichan Lee, Seoul (KR); Bongwook Chung, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 15/195,186

(22) Filed: Jun. 28, 2016

(65) Prior Publication Data

US 2017/0033246 A1    Feb. 2, 2017

(30) Foreign Application Priority Data

Jun. 30, 2015  (KR) .................. 10-2015-0093549

(51) Int. Cl.
| | | |
|---|---|---|
| *H01L 31/0352* | (2006.01) | |
| *H01L 31/036* | (2006.01) | |
| *H01L 31/18* | (2006.01) | |
| *H01L 31/105* | (2006.01) | |
| *H01L 31/032* | (2006.01) | |
| *C30B 29/68* | (2006.01) | |
| *C30B 29/32* | (2006.01) | |

(52) U.S. Cl.
CPC ...... *H01L 31/035263* (2013.01); *C30B 29/32* (2013.01); *C30B 29/68* (2013.01); *H01L 31/032* (2013.01); *H01L 31/036* (2013.01); *H01L 31/105* (2013.01); *H01L 31/18* (2013.01)

(58) Field of Classification Search
None
See application file for complete search history.

(56) References Cited

FOREIGN PATENT DOCUMENTS

| | | |
|---|---|---|
| JP | 2008-085327 A | 4/2008 |
| KR | 10-1989-0011102 A | 8/1989 |

*Primary Examiner* — Whitney T Moore
(74) *Attorney, Agent, or Firm* — NSIP Law

(57) ABSTRACT

Provided are an atomic layer junction oxide, a method of preparing the atomic layer junction oxide, and a photoelectric conversion device including the atomic layer junction oxide. The atomic layer junction oxide can include an n-type doped atomic layer oxide; an intrinsic atomic layer oxide; a p-type doped atomic layer oxide; and an intrinsic atomic layer oxide.

15 Claims, 7 Drawing Sheets

ATOMIC LAYER JUNCTION OXIDE AND PREPARING METHOD THEREOF

CROSS-REFERENCE TO RELATED APPLICATIONS

This application claims the benefit of Korean Patent Application No. 10-2015-0093549 filed on Jun. 30, 2015, the entire disclosure of which is incorporated herein by reference.

TECHNICAL FIELD

The present disclosure relates to an atomic layer junction oxide, a method of preparing the atomic layer junction oxide, and a photoelectric conversion device including the atomic layer junction oxide.

DESCRIPTION OF RELATED BACKGROUND ARTS

A photo diode has been widely used as a photoelectric conversion device by using a p-n junction, in which a DC voltage is generated by photovoltaic effect due to electron and hole generated by a photon absorbed by a junction layer of the photo diode. As new renewable energy becomes more important socially due to global warming and depletion of fossil fuels, expectations of a photoelectric conversion device capable of directly converting clean and inexhaustible solar energy into electric energy has been increased. Accordingly, studies for improving energy conversion efficiency of a photoelectric conversion device have been actively conducted.

Further, in order to improve energy conversion efficiency of a photoelectric conversion device, studies for improving light absorption efficiency in a photo diode or separation and collection efficiencies of electron and hole generated by an absorbed photon in a photo diode have been actively conducted. As a representative approach for improving light absorption efficiency of a photo diode, there is an attempt to substitute silicon (Si) which is an indirect transition-type material widely used as a material of a photo diode, with a direction transition-type compound semiconductor material. Recently, in order to obtain a high light absorption efficiency, there is an attempt to implement a multi-junction solar cell (or tandem cell) which is improved in light absorption efficiency in the whole wavelength range of sunlight by using a wide band-gap material as a surface and heteromaterials gradually decreased in band gap toward the inside of a photo diode as a multijunction structure so as to absorb photons of energy corresponding to the respective junctions in a selective and parallel manner. However, in order to implement a photo diode with a multijunction of heteromaterials, a complicated manufacturing process is needed, and, an interface defect may easily occur at a junction interface due to a lattice mismatch, which results in that a dangling bond of an interface defect induces recombination of electron and hole so that there is a limitation in materials suitable for a lattice match that induces epitaxial growth for high efficiency.

As a method for improving light absorption efficiency in addition to the multijunction structure, there is a method of forming an intermediate band in a forbidden area of an energy band gap to use photons by sequentially absorbing the photons from a valence band to a conduction band through the intermediate band, which results in a high light absorption efficiency with respect to photons in the whole wavelength range of sunlight. This method is applied to an intermediate band solar cell.

In order to improve charge separation and collection efficiencies, there is an attempt to reduce an interface defect at an interface between a light absorption layer and a passivation layer formed between a base, an emitter and a diode, and to increase a mobility of electron and hole, and this attempt can be easily found in polycrystalline materials or heterojunction materials. Further, in a conventional photo diode structure, each of n-type, p-type, and intrinsic materials has a microscale thickness, and thus an energy band is bent only at a junction. Therefore, the conventional photo diode structure has a fundamental limitation in that only electron and hole generated by photons can be easily moved at a junction interface by a potential difference.

The recent trend of study is to apply two-dimensional materials to photoelectric conversion, in which the two-dimensional materials have two-dimensionally perfect single crystal structure to have no junction defect and also have a high photocharge separation and collection efficiency since an energy band is bent in the entire region due to the low-dimensional structure. Further, a junction in a two-dimensional material causes an energy band to be bent at a small thickness, which results in that a sharp bending of the energy band caused by the small thickness enables an electron to move to a conduction band by tunneling and thus may increase light absorption efficiency.

Meanwhile, graphene, which is the most well known as a two-dimensional material, does not have a band gap by Klein tunneling and thus cannot be applied as a material of a photo diode. Accordingly, regarding application of a two-dimensional structure to a photoelectric conversion device, studies for applying molybdenum disulfide ($MoS_2$) or tungsten diselenide ($WSe_2$) which shows an energy band gap when exfoliated into a single layer, as a p-n junction atomic layer photo diode are mainly conducted.

Korean Patent Laid-open Publication No. 10-1989-0011102 discloses a method for forming a shallow junction, including: forming a film including a hydrogen compound containing one device selected from the group consisting of boron, phosphorous, and arsenic to a thickness of several atom layers to 1,000 Å on a silicon substrate; and annealing the film, whereby an impurity region having a depth of 1000 Å or less and an impurity concentration of $10^{18}$ to $10^{21}$ is formed in a surface layer of a silicon layer.

DISCLOSURE

Technical Problem

In view of the foregoing, the present disclosure provides an atomic layer junction oxide, a preparing method of the atomic layer junction oxide, and a photoelectric conversion device including the atomic layer junction oxide.

However, problems to be solved by the present disclosure are not limited to the above-described problems. Although not described herein, other problems to be solved by the present disclosure can be clearly understood by those skilled in the art from the following descriptions.

Technical Solution

In a first aspect, provided is an atomic layer junction oxide, which is formed by alternately laminating an n-type doped atomic layer oxide, an intrinsic atomic layer oxide, a p-type doped atomic layer oxide, and an intrinsic atomic layer oxide.

In a second aspect, provided is a method of preparing an atomic layer junction oxide, comprising alternately performing the steps of forming an n-type doped atomic layer oxide on a substrate, forming an intrinsic atomic layer oxide on the n-type doped atomic layer oxide, forming a p-type doped atomic layer oxide on the intrinsic atomic layer oxide, and forming an intrinsic atomic layer oxide on the p-type doped atomic layer oxide.

In a third aspect, provided is a photoelectric conversion device comprising an atomic layer junction oxide formed by alternately laminating an n-type doped atomic layer oxide, an intrinsic atomic layer oxide, a p-type doped atomic layer oxide, and an intrinsic atomic layer oxide according to the first aspect, a base formed by contact with the n-type doped atomic layer oxide, the intrinsic atomic layer oxide, the p-type doped atomic layer oxide, and the intrinsic atomic layer oxide, and an emitter formed to face the base.

Effects of the Invention

According to any one of embodiments of the present disclosure, the atomic layer junction oxide may have a high light absorption efficiency in the whole wavelength range of sunlight by adjusting of an effective band gap by an intermediate band appearing in the intrinsic atomic layer oxide region in contact with a layer of the n-type doped atomic layer oxide or a layer of the p-type doped atomic layer oxide. Due to the intermediate band appearing by an atomic layer junction, photons can be absorbed from a valence band to the intermediate band and from the intermediate band to a conduction band, which allows that a high light absorption efficiency can be achieved in the whole wavelength range of sunlight.

According to any one of embodiments of the present disclosure, each of the n-type doped atomic layer oxide, the p-type doped atomic layer oxide, and the intrinsic atomic layer oxide may have an atomic layer-level thickness.

According to any one of embodiments of the present disclosure, an energy band bending may appear in the entire region of the photoelectric conversion device in a real space due to the n-type doped atomic layer oxide and the p-type doped atomic layer oxide each having an atomic layer-level thickness. The energy band bending in the entire region of the photoelectric conversion device enables electron and hole to be affected by an electric field in the entire region of the photoelectric conversion device and thus to be moved to the base and the emitter, which results in that photocharge separation and collection efficiency can be improved.

BRIEF DESCRIPTION OF THE DRAWINGS

FIG. 5A, FIG. 5B, and FIG. 5C are real-space energy band diagrams and state density graphs of $La:SrTiO_3—SrTiO_3—In:SrTiO_3—SrTiO_3$, $La:SrTiO_3—SrTiO_3—N:SrTiO_3—SrTiO_3$, and $La:SrTiO_3—SrTiO_3—Sr:La\ MnO_3—SrTiO_3$, respectively.

FIG. 6A and FIG. 68 are graphs showing a local electron state density of a layer of the p-type doped atomic layer oxide with respect to FIG. 5B in accordance with an example of the present disclosure.

DETAILED DESCRIPTION

Figure 1A:
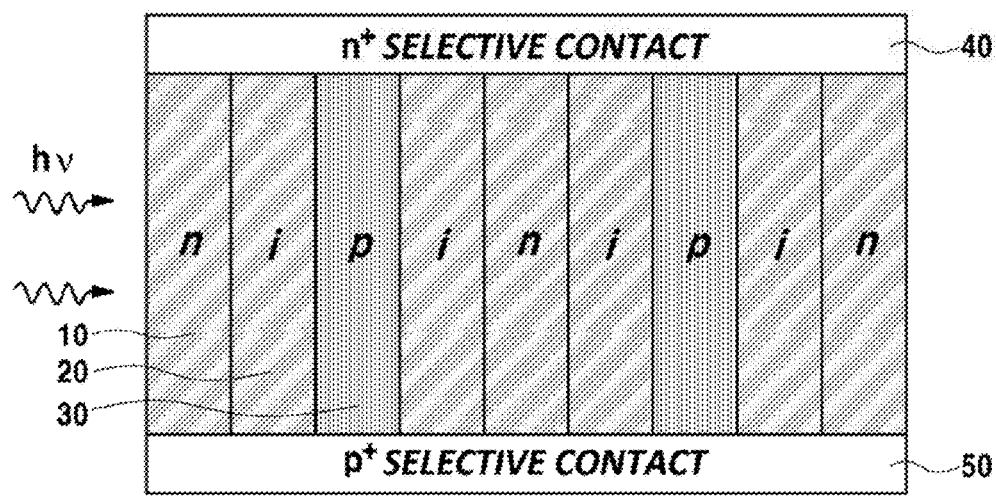
FIG. 1A is a side configuration view of an atomic layer junction oxide in an embodiment of the present disclosure.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the term "on" that is used to designate a position of one element with respect to another element includes both a case that the one element is adjacent to the another element and a case that any other element exists between these two elements.

Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" are intended to have meanings close to numerical values or ranges specified with an allowable error and intended to prevent accurate or absolute numerical values disclosed for understanding of the present disclosure from being illegally or unfairly used by any unconscionable third party.

Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Hereinafter, embodiments of the present disclosure will be described in detail. However, the present disclosure may not be limited to the following embodiments.

In embodiment first aspect of the present disclosure, provided is an atomic layer junction oxide, which is formed by alternately laminating an n-type doped atomic layer oxide, an intrinsic atomic layer oxide, a p-type doped atomic layer oxide, and an intrinsic atomic layer oxide.

In an embodiment of the present disclosure, the n-type doped atomic layer oxide may include a compound as represented by the following Chemical Formula 1, but is not limited thereto:

$$n\text{-type doped } ABO_3; \quad\quad\quad \text{[Chemical Formula 1]}$$

in Chemical Formula 1, A may include a cation of a metal selected from the group consisting of Mg, Ca, Sr, Nb, Ba, La, Eu, Gd, Pb, Bi, and combinations thereof; B may include a cation of a metal selected from the group consisting of Al, Ti, V, Mn, Fe, Co, Ga, Zr, In, Sn, and combinations thereof; and O may include a divalent anion of O ($O^{-2}$), but may not be limited thereto. For example, in Chemical Formula 1, A may include divalent or trivalent metal cation and B may include a trivalent or tetravalent metal cation, but may not be limited thereto.

In an embodiment of the present disclosure, the intrinsic atomic layer oxide may include a compound as represented by the following Chemical Formula 2, but may not be limited thereto:

$$A'B'O_3; \quad\quad\quad \text{[Chemical Formula 2]}$$

in Chemical Formula 2, A' may include a cation of a metal selected from the group consisting of Mg, Ca, Sr, Nb, Ba, La, Eu, Gd, Pb, Bi, and combinations thereof; B' may include a cation of a metal selected from the group consisting of Al, Ti, V, Mn, Fe, Co, Ga, Zr, In, Sn, and combinations thereof; and O may include a divalent anion of ($O^{-2}$), but may not be limited thereto. For example, in Chemical Formula2, A' may include divalent or trivalent metal cation and B' may include a trivalent or tetravalent metal cation, but may not be limited thereto.

In an embodiment of the present disclosure, the p-type doped atomic layer oxide may include a compound as represented by the following Chemical Formula 3, but may not be limited thereto:

$$p\text{-type doped } A''B''O_3; \quad\quad\quad \text{[Chemical Formula 3]}$$

in Chemical Formula 3, A" may include a cation of a metal selected from the group consisting of Mg, Ca, Sr, Nb, Ba, La, Eu, Gd, Pb, Bi, and combinations thereof; B" may include a cation of a metal selected from the group consisting of Al, Ti, V, Mn, Fe, Co, Ga, Zr, In, Sn, and combinations thereof; and O may include a divalent anion of ($O^{-2}$), but may not be limited thereto. For example, in Chemical Formula 3, A" may include divalent or trivalent metal cation and B" may include a trivalent or tetravalent metal cation, but may not be limited thereto.

In an embodiment of the present disclosure, the atomic layer junction oxide may include an oxide with a Perovskite structure, and light absorption may be carried out in the oxide with a Perovskite structure, but may not be limited thereto.

In an embodiment of the present disclosure, the atomic layer junction oxide may have a high light absorption efficiency in the whole wavelength range of sunlight by adjusting of an effective band gap by an intermediate band, but may not be limited thereto. Due to the intermediate band appearing in the intrinsic atomic layer oxide region in contact with a layer of the n-type doped atomic layer oxide or a layer of the p-type doped atomic layer oxide, a photon can be absorbed from a valence band to the intermediate band and from the intermediate band to a conduction band, which results in that a high light absorption efficiency can be achieved in the whole wavelength range of sunlight.

In an embodiment of the present disclosure, the intrinsic atomic layer oxide may include an oxide represented as $A'^{2+}B'^{4+}O_3$ or $A'^{3}B'^{3+}O_3$, but may not be limited thereto. For example, the intrinsic atomic layer oxide represented as $A'^{2}B'^{4+}O_3$ may include an oxide selected from the group consisting of $MgTiO_3$, $CaTiO_3$, $SrTiO_3$, $BaTiO_3$, $MgVO_3$, $CaVO_3$, $SrVO_3$, $BaVO_3$, $MgZrO_3$, $CaZrO_3$, $SrZrO_3$, $BaZrO_3$, $MgSnO_3$, $CaSnO_3$, $SrSnO_3$, $BaSnO_3$, and combinations thereof, but may not be limited thereto. For example, the intrinsic atomic layer oxide represented as $A'^{3}B'^{3+}O_3$ may include an oxide selected from the group consisting of $NbAlO_3$, $LaAlO_3$, $EuAlO_3$, $GdAlO_3$, $BiAlO_3$, $NbMnO_3$, $LaMnO_3$, $EuMnO_3$, $GdMnO_3$, $BiMnO_3$, $NbFeO_3$, $LaFeO_3$, $EuFeO_3$, $GdFeO_3$, $BiFeO_3$, $NbCoO_3$, $LaCoO_3$, $EuCoO_3$, $GdCoO_3$, $BiCoO_3$, $NbGaO_3$, $LaGaO_3$, $EuGaO_3$, $GdGaO_3$, $BiGaO_3$, $LaInO_3$, $EuInO_3$, $GdInO_3$, $BiInO_3$, and combinations thereof, but may not be limited thereto.

In an embodiment of the present disclosure, the n-type doped atomic layer oxide may include: a compound obtained from an oxide represented as $A^{2+}B^{4+}O_3$ by substituting a part of $A^{2+}$ with a trivalent metal cation or a part of $B^{4+}$ with a pentavalent or hexavalent metal cation; a compound obtained from an oxide represented as $A^{3+}B^{3+}O_3$ by substituting a part of $B^{3+}$ with a tetravalent, pentavalent or hexavalent metal cation; or a compound obtained from an oxide represented as $A^{2+}B^{4+}O_2$ or $A^{3+}B^{3+}O_3$ by substituting a part of $O^{2-}$ with a monovalent anion, but may not be limited thereto.

For example, in the n-type doped atomic layer oxide, the oxide represented as $A^{2+}B^{4+}O_3$ may include an oxide selected from the group consisting of $MgTiO_3$, $CaTiO_3$, $SrTiO_3$, $BaTiO_3$, $MgVO_3$, $CaVO_3$, $SrVO_3$, $BaVO_3$, $MgZrO_3$, $CaZrO_3$, $SrZrO_3$, $BaZrO_3$, $MgSnO_3$, $CaSnO_3$, $SrSnO_3$, $BaSnO_3$, and combinations thereof, and the n-type doped atomic layer oxide may include a compound obtained from the oxide by substituting a part of $A^{2+}$ with a trivalent metal cation of Nb, La, Eu, Gd, or Bi; a part of $B^{4+}$ with a pentavalent metal cation of Nb or Sb; or a part of $B^{4+}$ with a hexavalent metal cation of Mo or W, but may not be limited thereto.

For example, in the n-type doped atomic layer oxide, the oxide represented as $A^{3+}B^{3+}O_3$ may include an oxide selected from the group consisting of $NbAlO_3$, $LaAlO_3$, $EuAlO_3$, $GdAlO_3$, $BiAlO_3$, $NbMnO_3$, La $MnO_3$, $EuMnO_3$, $GdMnO_3$, $BiMnO_3$, $NbFeO_3$, $LaFeO_3$, $EuFeO_3$, $GdFeO_3$, $BiFeO_3$, $NbCoO_3$, $LaCoO_3$, $EuCoO_3$, $GdCoO_3$, $BiCoO_3$, $NbGaO_3$, $LaGaO_3$, $EuGaO_3$, $GdGaO_3$, $BiGaO_3$, $LaInO_3$, $EuInO_3$, $GdInO_3$, $BiInO_3$, and combinations thereof, and the n-type doped atomic layer oxide may include a compound obtained from the oxide by substituting a part of $B^{+3}$ with a tetravalent metal cation of Ti, V, Zr, or Sn; with a pentavalent metal cation of Nb or Sb; or a hexavalent metal cation of Mo or W, but may not be limited thereto.

For example, in the n-type doped atomic layer oxide, the oxide represented as $A^{2+}B^{4+}O_3$ or $A^{3+}B^{3+}O_3$ may include an oxide selected from the group consisting of $MgTiO_3$, $CaTiO_3$, $SrTiO_3$, $BaTiO_3$, $MgVO_3$, $CaVO_3$, $SrVO_3$, $BaVO_3$, $MgZrO_3$, $CaZrO_3$, $SrZrO_3$, $BaZrO_3$, $MgSnO_3$, $CaSnO_3$, $SrSnO_3$, $BaSnO_3$, $NbAlO_3$, $LaAlO_3$, $EuAlO_3$, $GdAlO_3$, $BiAlO_3$, $NbMnO_3$, $LaMnO_3$, $EuMnO_3$, $GdMnO_3$, $BiMnO_3$, $NbFeO_3$, $LaFeO_3$, $EuFeO_3$, $GdFeO_3$, $BiFeO_3$, $NbCoO_3$, $LaCoO_3$, $EuCoO_3$, $GdCoO_3$, $BiCoO_3$, $NbGaO_3$, $LaGaO_3$, $EuGaO_3$, $GdGaO_3$, $BiGaO_3$, $LaInO_3$, $EuInO_3$, $GdInO_3$, $BiInO_3$, and combinations thereof, and the n-type doped atomic layer oxide may include a compound obtained from the oxide by substituting a part of $O^{2-}$ with a monovalent anion of F, but may not be limited thereto.

In an embodiment of the present disclosure, the p-type doped atomic layer oxide may include: a compound obtained from an oxide represented as $A''^{2+}B'''^{4+}O_3$ by substituting a part of $A''^{2+}$ with a monovalent metal cation or a part of $B'''^{4+}$ with a trivalent metal cation; a compound obtained from an oxide represented as $A''^{3+}B''^{3+}O_3$ by substituting a part of $A'^{3+}$ with a monovalent or bivalent metal cation or a part of $B''^{3+}$ with a tetravalent metal cation; or a compound obtained from an oxide represented as $A''^{2+}B'''^{4+}O_3$ or $A''^{3+}B''^{3+}O_3$ by substituting a part of $O^{2-}$ with a trivalent or tetravalent anion, but may not be limited thereto.

For example, in the p-type doped atomic layer oxide, the oxide represented as $A''^{2+}B'''^{4+}O_3$ may include an oxide selected from the group consisting of $MgTiO_3$, $CaTiO_3$, $SrTiO_3$, $BaTiO_3$, $MgVO_3$, $CaVO_3$, $SrVO_3$, $BaVO_3$, $MgZrO_3$, $CaZrO_3$, $SrZrO_3$, $BaZrO_3$, $MgSnO_3$, $CaSnO_3$, $SrSnO_3$, $BaSnO_3$, and combinations thereof, and the p-type doped atomic layer oxide may include a compound obtained from the oxide by substituting a part of $A''^{2+}$ with a monovalent metal cation of Na, K, Rb, or Cs; or a part of $B'''^{4+}$ with a trivalent metal cation of Al, Mn, Fe, Co, Ga, or In, but may not be limited thereto.

For example, in the p-type doped atomic layer oxide, the oxide represented as $A''^{3+}B''^{3+}O_3$ may include an oxide selected from the group consisting of $NbAlO_3$, $LaAlO_3$, $EuAlO_3$, $GdAlO_3$, $BiAlO_3$, $NbMnO_3$, $LaMnO_3$, $EuMnO_3$, $GdMnO_3$, $BiMnO_3$, $NbFeO_3$, $LaFeO_3$, $EuFeO_3$, $GdFeO_3$, $BiFeO_3$, $NbCoO_3$, $LaCoO_3$, $EuCoO_3$, $GdCoO_3$, $BiCoO_3$, $NbGaO_3$, $LaGaO_3$, $EuGaO_3$, $GdGaO_3$, $BiGaO_3$, $LaInO_3$, $EuInO_3$, $GdInO_3$, $BiInO_3$, and combinations thereof, and the p-type doped atomic layer oxide may include a compound obtained from the oxide by substituting a part of $A''^{3+}$ with a monovalent metal cation of Na, K, Rb, or Cs; a part of $A'^{3+}$ with a bivalent metal cation of Ma, Ca, Sr, or Ba; or a part of $B''^{3+}$ with a tetravalent metal cation of Ti, V, Zr, or Sn, but may not be limited thereto.

For example, in the p-type doped atomic layer oxide, the oxide represented as $A''^{2+}B'''^{4+}O_3$ or $A''^{3+}B''^{3+}O_3$ may include an oxide selected from the group consisting of $MgTiO_3$, $CaTiO_3$, $SrTiO_3$, $BaTiO_3$, $MgVO_3$, $CaVO_3$, $SrVO_3$, $BaVO_3$, $MgZrO_3$, $CaZrO_3$, $SrZrO_3$, $BaZrO_3$, $MgSnO_3$, $CaSnO_3$, $SrSnO_3$, $BaSnO_3$, $NbAlO_3$, $LaAlO_3$, $EuAlO_3$, $GdAlO_3$, $BiAlO_3$, $NbMnO_3$, $LaMnO_3$, $EuMnO_3$, $GdMnO_3$, $BiMnO_3$, $NbFeO_3$, $LaFeO_3$, $EuFeO_3$, $GdFeO_3$, $BiFeO_3$, $NbCoO_3$, $LaCoO_3$, $EuCoO_3$, $GdCoO_3$, $BiCoO_3$, $NbGaO_3$, $LaGaO_3$, $EuGaO_3$, $GdGaO_3$, $BiGaO_3$, $LaInO_3$, $EuInO_3$, $GdInO_3$, $BiInO_3$, and combinations thereof, and the p-type doped atomic layer oxide may include a compound obtained from the oxide by substituting a part of $O^{2-}$ with a trivalent anion of N or P or a tetravalent anion of C, but may not be limited thereto.

In an embodiment of the present disclosure, a structure of the atomic layer junction oxide may be configured as homojunction or heterojunction which can induce epitaxial growth, but may not be limited thereto. The epitaxial growth means growth of a certain crystal on a surface of another crystal with a specific orientation relationship.

In an embodiment of the present disclosure, the n-type doped atomic layer oxide and the p-type doped atomic layer oxide may have the same thickness, but may not be limited thereto. For example, the n-type doped atomic layer oxide and the p-type doped atomic layer oxide may have a thickness small enough to efficiently separate electron and hole, but may not be limited thereto. As the thickness of the n-type doped atomic layer oxide and the p-type doped atomic layer oxide is increased, photocharge separation efficiency may be decreased. Therefore, desirably, the thickness may not be greatly increased. Due to an atomic layer-level thickness of the n-type doped atomic layer oxide and the p-type doped atomic layer oxide, an energy band bending may appear in the atomic layer oxide in a real space.

In an embodiment of the present disclosure, the intrinsic atomic layer oxide may have a thickness identical to or different from the thickness of the n-type doped atomic layer oxide and the p-type doped atomic layer oxide, but may not be limited thereto.

In an embodiment of the present disclosure, the atomic layer junction oxide formed by alternately laminating the n-type doped atomic layer oxide, the intrinsic atomic layer oxide, the p-type doped atomic layer oxide, and the intrinsic atomic layer oxide may be formed by laminating each atomic layer oxide by about 10 times or less, but may not be limited thereto. For example, the number of times of the laminating may be about 10 times or less, about 8 times or less, about 6 times or less, or about 4 times or less, but may not be limited thereto.

In embodiment second aspect of the present disclosure, provided is a method of preparing an atomic layer junction oxide, comprising alternately performing the steps of forming an n-type doped atomic layer oxide on a substrate, forming an intrinsic atomic layer oxide on the n-type doped atomic layer oxide, forming a p-type doped atomic layer oxide on the intrinsic atomic layer oxide, and forming an intrinsic atomic layer oxide on the p-type doped atomic layer oxide.

The second aspect relates to the preparing method of an atomic layer junction oxide, and detailed descriptions of the repeated parts as described in the first aspect will be omitted. Although omitted in the second aspect of the present disclosure, the description of the first aspect of the present disclosure may also be applied in the same manner to the second aspect.

In an embodiment of the present disclosure, the forming of the n-type doped atomic layer oxide may include laminating an intrinsic atomic layer oxide and n-doping the intrinsic atomic layer oxide, but may not be limited thereto.

In an embodiment of the present disclosure, the forming of the p-type doped atomic layer oxide may include laminating an intrinsic atomic layer oxide and p-doping the intrinsic atomic layer oxide, but may not be limited thereto.

In an embodiment of the present disclosure, the n-type doped atomic layer oxide may include a compound as represented by the following Chemical Formula 1, but may not be limited thereto:

$n$-type doped $ABO_3$;  [Chemical Formula 1]

in Chemical Formula 1, A may include a cation of a metal selected from the group consisting of Mg, Ca, Sr, Nb, Ba, La, Eu, Gd, Pb, Bi, and combinations thereof; B may include a cation of a metal selected from the group consisting of Al, Ti, V, Mn, Fe, Co, Ga, Zr, In, Sn, and combinations thereof; and O may include a divalent anion of $O(O^{-2})$, but may not be limited thereto. For example, in Chemical Formula 1, A may include divalent or trivalent metal cation and B may include a trivalent or tetravalent metal cation, but may not be limited thereto.

In an embodiment of the present disclosure, the intrinsic atomic layer oxide may include a compound as represented by the following Chemical Formula 2, but may not be limited thereto:

A'B'O$_3$;                      [Chemical Formula 2]

in Chemical Formula 2, A may include a cation of a metal selected from the group consisting of Mg, Ca, Sr, Nb, Ba, La, Eu, Gd, Pb, Bi, and combinations thereof; B' may include a cation of a metal selected from the group consisting of Al, Ti, V, Mn, Fe, Co, Ga, Zr, In, Sn, and combinations thereof; and O may include a divalent anion of (O$^{-2}$), but may not be limited thereto. For example, in Chemical Formula2, A' may include divalent or trivalent metal cation and B' may include a trivalent or tetravalent metal cation, but may not be limited thereto.

In an embodiment of the present disclosure, the p-type doped atomic layer oxide may include a compound as represented by the following Chemical Formula 3, but may not be limited thereto:

p-type doped A"B"O$_3$;                      [Chemical Formula 3]

in Chemical Formula 3, A" may include a cation of a metal selected from the group consisting of Mg, Ca, Sr, Nb, Ba, La, Eu, Gd, Pb, Bi, and combinations thereof; B" may include a cation of a metal selected from the group consisting of Al, Ti, V, Mn, Fe, Co, Ga, Zr, In, Sn, and combinations thereof; and O may include a divalent anion of (O$^{-2}$), but may not be limited thereto. For example, in Chemical Formula 3, A" may include divalent or trivalent metal cation and B" may include a trivalent or tetravalent metal cation, but may not be limited thereto.

In an embodiment of the present disclosure, the intrinsic atomic layer oxide may include an oxide represented as A'$^{2+}$B'$^{4+}$O$_3$ or A'$^{3+}$B'$^{3+}$O$_3$, but may not be limited thereto. For example, the intrinsic atomic layer oxide represented as A'$^{2+}$B'$^{4+}$O$_3$ may include an oxide selected from the group consisting of MgTiO$_3$, CaTiO$_3$, SrTiO$_3$, BaTiO$_3$, MgVO$_3$, CaVO$_3$, SrVO$_3$, BaVO$_3$, MgZrO$_3$, CaZrO$_3$, SrZrO$_3$, BaZrO$_3$, MgSnO$_3$, CaSnO$_3$, SrSnO$_3$, BaSnO$_3$, and combinations thereof, but may not be limited thereto. For example, the intrinsic atomic layer oxide represented as A'$^{3+}$B'$^{3+}$O$_3$ may include an oxide selected from the group consisting of NbAlO$_3$, LaAlO$_3$, EuAlO$_3$, GdAlO$_3$, BiAlO$_3$, NbMnO$_3$, LaMnO$_3$, EuMnO$_3$, GdMnO$_3$, BiMnO$_3$, NbFeO$_3$, LaFeO$_3$, EuFeO$_3$, GdFeO$_3$, BiFeO$_3$, NbCoO$_3$, LaCoO$_3$, EuCoO$_3$, GdCoO$_3$, BiCoO$_3$, NbGaO$_3$, LaGaO$_3$, EuGaO$_3$, GdGaO$_3$, BiGaO$_3$, LaInO$_3$, EuInO$_3$, GdInO$_3$, BiInO$_3$, and combinations thereof, but may not be limited thereto.

In an embodiment of the present disclosure, the n-type doped atomic layer oxide may include: a compound obtained from an oxide represented as A$^{2+}$B$^{4+}$O$_3$ by substituting a part of A$^{3+}$ with a trivalent metal cation or a part of B$^{4+}$ with a pentavalent or hexavalent metal cation; a compound obtained from an oxide represented as A$^{3+}$B$^{3+}$O$_3$ by substituting a part of B$^{3+}$ with a tetravalent, pentavalent or hexavalent metal cation; or a compound obtained from an oxide represented as A$^{2+}$B$^{4+}$O$_3$ or A$^{3+}$B$^{3+}$O$_3$ by substituting a part of O' with a monovalent anion, but may not be limited thereto.

For example, in the n-type doped atomic layer oxide, the oxide represented as A$^{2+}$B$^{4+}$O$_3$ may include an oxide selected from the group consisting of MgTiO$_3$, CaTiO$_3$, SrTiO$_3$, BaTiO$_3$, MgVO$_3$, CaVO$_3$, SrVO$_3$, BaVO$_3$, MgZrO$_3$, CaZrO$_3$, SrZrO$_3$, BaZrO$_3$, MgSnO$_3$, CaSnO$_3$, SrSnO$_3$, BaSnO$_3$, and combinations thereof, and the n-type doped atomic layer oxide may include a compound obtained from the oxide by substituting a part of A$^{2+}$ with a trivalent metal cation of Nb, La, Eu, Gd, or Bi; a part of B$^{4+}$ with a pentavalent metal cation of Nb or Sb; or a part of B$^{4+}$ with a hexavalent metal cation of Mo or W, but may not be limited thereto.

For example, in the n-type doped atomic layer oxide, the oxide represented as A$^{3+}$B$^{3+}$O$_3$ may include an oxide selected from the group consisting of NbAlO$_3$, LaAlO$_3$, EuAlO$_3$, GdAlO$_3$, BiAlO$_3$, NbMnO$_3$, LaMnO$_3$, EuMnO$_3$, GdMnO$_3$, BiMnO$_3$, NbFeO$_3$, LaFeO$_3$, EuFeO$_3$, GdFeO$_3$, BiFeO$_3$, NbCoO$_3$, LaCoO$_3$, EuCoO$_3$, GdCoO$_3$, BiCoO$_3$, NbGaO$_3$, LaGaO$_3$, EuGaO$_3$, GdGaO$_3$, BiGaO$_3$, LaInO$_3$, EuInO$_3$, GdInO$_3$, BiInO$_3$, and combinations thereof, and the n-type doped atomic layer oxide may include a compound obtained from the oxide by substituting a part of B$^{+3}$ with a tetravalent metal cation of Ti, V, Zr, or Sn; with a pentavalent metal cation of Nb or Sb; or a hexavalent metal cation of Mo or W, but may not be limited thereto.

For example, in the n-type doped atomic layer oxide, the oxide represented as A$^{2+}$B$^{4+}$O$_3$ or A$^{3+}$B$^{3+}$O$_3$ may include an oxide selected from the group consisting of MgTiO$_3$, CaTiO$_3$, SrTiO$_3$, BaTiO$_3$, MgVO$_3$, CaVO$_3$, SrVO$_3$, BaVO$_3$, MgZrO$_3$, CaZrO$_3$, SrZrO$_3$, BaZrO$_3$, MgSnO$_3$, CaSnO$_3$, SrSnO$_3$, BaSnO$_3$, NbAlO$_3$, LaAlO$_3$, EuAlO$_3$, GdAlO$_3$, BiAlO$_3$, NbMnO$_3$, LaMnO$_3$, EuMnO$_3$, GdMnO$_3$, BiMnO$_3$, NbFeO$_3$, LaFeO$_3$, EuFeO$_3$, GdFeO$_3$, BiFeO$_3$, NbCoO$_3$, LaCoO$_3$, EuCoO$_3$, GdCoO$_3$, BiCoO$_3$, NbGaO$_3$, LaGaO$_3$, EuGaO$_3$, GdGaO$_3$, BiGaO$_3$, LaInO$_3$, EuInO$_3$, GdInO$_3$, BiInO$_3$, and combinations thereof, and the n-type doped atomic layer oxide may include a compound obtained from the oxide by substituting a part of O$^{2-}$ with a monovalent anion of F, but may not be limited thereto.

In an embodiment of the present disclosure, the p-type doped atomic layer oxide may include: a compound obtained from an oxide represented as A"$^{2+}$B"$^{4+}$O$_3$ by substituting a part of A"$^{2+}$ with a monovalent metal cation or a part of B"$^{4+}$ with a trivalent metal cation; a compound obtained from an oxide represented as A"$^{3+}$B"$^{3+}$O$_3$ by substituting a part of A"$^{3+}$ with a monovalent or bivalent metal cation or a part of B"$^{3+}$ with a tetravalent metal cation; or a compound obtained from an oxide represented as A"$^{2+}$B"$^{4+}$O$_3$ or A"$^{3+}$B"$^{3+}$O$_3$ by substituting a part of O$^{2-}$ with a trivalent or tetravalent anion, but may not be limited thereto.

For example, in the p-type doped atomic layer oxide, the oxide represented as A"$^{2+}$B"$^{4+}$O$_3$ may include an oxide selected from the group consisting of MgTiO$_3$, CaTiO$_3$, SrTiO$_3$, BaTiO$_3$, MgVO$_3$, CaVO$_3$, SrVO$_3$, BaVO$_3$, MgZrO$_3$, CaZrO$_3$, SrZrO$_3$, BaZrO$_3$, MgSnO$_3$, CaSnO$_3$, SrSnO$_3$, BaSnO$_3$, and combinations thereof, and the p-type doped atomic layer oxide may include a compound obtained from the oxide by substituting a part of A"$^{2+}$ with a monovalent metal cation of Na, K, Rb, or Cs; or a part of B"$^{4+}$ with a trivalent metal cation of Al, Mn, Fe, Co, Ga, or In, but may not be limited thereto.

For example, in the p-type doped atomic layer oxide, the oxide represented as A"$^{3+}$B"$^{3+}$O$_3$ may include an oxide selected from the group consisting of NbAlO$_3$, LaAlO$_3$, EuAlO$_3$, GdAlO$_3$, BiAlO$_3$, NbMnO$_3$, LaMnO$_3$, EuMnO$_3$, GdMnO$_3$, BiMnO$_3$, NbFeO$_3$, LaFeO$_3$, EuFeO$_3$, GdFeO$_3$, BiFeO$_3$, NbCoO$_3$, LaCoO$_3$, EuCoO$_3$, GdCoO$_3$, BiCoO$_3$, NbGaO$_3$, LaGaO$_3$, EuGaO$_3$, GdGaO$_3$, BiGaO$_3$, La InO$_3$, EuInO$_3$, GdInO$_3$, BiInO$_3$, and combinations thereof, and the p-type doped atomic layer oxide may include a compound obtained from the oxide by substituting a part of A"$^{3+}$ with a monovalent metal cation of Na, K, Rb, or Cs; a part of A"$^{3+}$ with a bivalent metal cation of Ma, Ca, Sr, or Ba; or a part of $B''^{3+}$ with a tetravalent metal cation of Ti, V, Zr, or Sn, but may not be limited thereto.

For example, in the p-type doped atomic layer oxide, the oxide represented as $A''^{2+}B''''^{4+}O_3$ or $A''^{3+}B''^{3+}O_3$ may include an oxide selected from the group consisting of $MgTiO_3$, $CaTiO_3$, $SrTiO_3$, $BaTiO_3$, $MgVO_3$, $CaVO_3$, $SrVO_3$, $BaVO_3$, $MgZrO_3$, $CaZrO_3$, $SrZrO_3$, $BaZrO_3$, $MgSnO_3$, $CaSnO_3$, $SrSnO_3$, $BaSnO_3$, $NbAlO_3$, $LaAlO_3$, $EuAlO_3$, $GdAlO_3$, $BiAlO_3$, $NbMnO_3$, $LaMnO_3$, $EuMnO_3$, $GdMnO_3$, $BiMnO_3$, $NbFeO_3$, $LaFeO_3$, $EuFeO_3$, $GdFeO_3$, $BiFeO_3$, $NbCoO_3$, $LaCoO_3$, $EuCoO_3$, $GdCoO_3$, $BiCoO_3$, $NbGaO_3$, $LaGaO_3$, $EuGaO_3$, $GdGaO_3$, $BiGaO_3$, $LaInO_3$, $EuInO_3$, $GdInO_3$, $BiInO_3$, and combinations thereof, and may the p-type doped atomic layer oxide include a compound obtained from the oxide by substituting a part of $O^{2-}$ with a trivalent anion of N or P or a tetravalent anion of C, but may not be limited thereto.

In an embodiment of the present disclosure, the n-type doped atomic layer oxide and the p-type doped atomic layer oxide may have the same thickness, but may not be limited thereto.

In an embodiment of the present disclosure, the atomic layer junction oxide may be formed by alternately laminating: the n-type doped atomic layer oxide; the intrinsic atomic layer oxide; the p-type doped atomic layer oxide; and the intrinsic atomic layer oxide by about 10 times or less, but may not be limited thereto.

In a third aspect of the present disclosure, a photoelectric conversion device comprising an atomic layer junction oxide according to the first aspect of the present disclosure, which is formed by alternately laminating an n-type doped atomic layer oxide, an intrinsic atomic layer oxide, a p-type doped atomic layer oxide, and an intrinsic atomic layer oxide according to the first aspect, a base formed by contact with the n-type doped atomic layer oxide, the intrinsic atomic layer oxide, the p-type doped atomic layer oxide, and the intrinsic atomic layer oxide, and an emitter formed to face the base.

The third aspect of the present disclosure relates to the photoelectric conversion device, and detailed descriptions of the repeated parts as described in the first aspect of the present disclosure will be omitted. Although omitted in the third aspect of the present disclosure, the description of the first aspect of the present disclosure may also be applied in the same manner to the third aspect.

The atomic layer junction oxide may have an artificial oxide superlattice structure including an n-type doped atomic layer oxide and a p-type doped atomic layer oxide so as to be applied to the photoelectric conversion device. As compared with conventional multi-junction solar cell using heteromaterials, the atomic layer junction oxide uses a junction between perovskite materials having similar lattice constants and thus can suppress an interface defect caused by a lattice mismatch. Further, the thickness of each of the n-type doped atomic layer oxide and the p-type doped atomic layer oxide is limited to an atomic layer level. Thus, an effective band gap of a junction material can be adjusted depending on an energy band bending. Furthermore, an energy band is bent in the entire region of the photoelectric conversion device. Thus, the base and the emitter may be configured to be applied with an electric field to collect a great amount of electron and hole.

Hereinafter, the photoelectric conversion device including the atomic layer junction oxide according to an embodiment of the present disclosure will be described in detail with reference to FIG. 1A and FIG. 1B.

FIG. 1A is a side configuration view of a high-efficiency photoelectric conversion atomic layer junction oxide. An n-type doped atomic layer oxide (10, n), an intrinsic atomic layer oxide (20, i), a p-type doped atomic layer oxide (30, p), and an intrinsic atomic layer oxide are repeatedly laminated on a surface of the photoelectric conversion atomic layer junction oxide, so that a multijunction structure (n-i-p-i structure) in the form of an artificial superlattice is formed. Referring to FIG. 1A, an $n^+$ selective contact enables an electron generated in the intrinsic atomic layer oxide layer to be collected in an $n^+$ layer through the n-type doped atomic layer oxide layer, and a $p^+$ selective contact enables a hole to be collected in a $p^+$ layer through the p-type doped atomic layer oxide layer, but may not be limited thereto. The n-type doped atomic layer oxide and the p-type doped atomic layer oxide may have a thickness of about 1 to about 10 unit cell thickness in order to improve light absorption efficiency and efficiently separate and collect electron and hole, but may not be limited thereto. For example, the unit cell thickness may include from about 1 to about 10 unit cells, from about 1 to about 8 unit cells, from about 1 to about 6 unit cells, from about 1 to about 4 unit cells, from about 4 to about 10 unit cells, from about 4 to about 8 unit cells, from about 4 to about 6 unit cells, or from about 6 to about 10 unit cells, but may not be limited thereto.

Figure 1B:
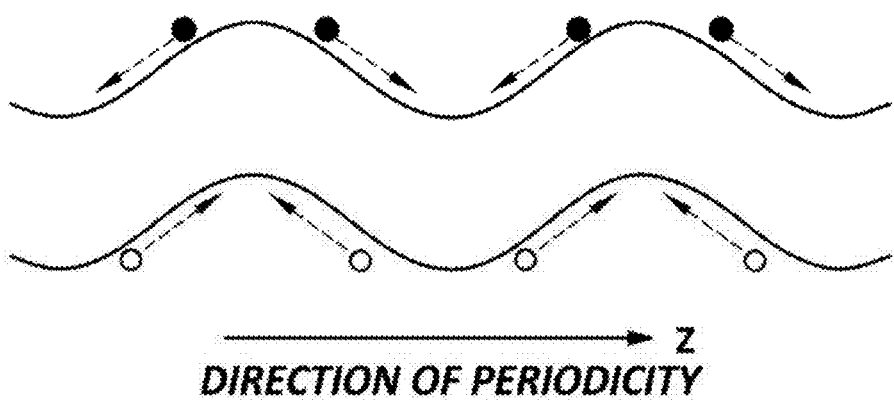
FIG. 1B is an image illustrating an energy band bending in a real space according to the side configuration view illustrated in FIG. 1A.

As shown in FIG. 1A and FIG. 1B, if the n-i-p-i structure including the n-type doped atomic layer oxide (10), the intrinsic atomic layer oxide (20), and the p-type doped atomic layer oxide (30) each having from 1 to 10 unit cells thickness is repeatedly laminated, an energy band is sharply bent in a real space due to a small thickness of the n-type doped atomic layer oxide layer and the p-type doped atomic layer oxide illustrated in FIG. 1B. Therefore, an effective band gap can be adjusted, and electron and hole generated by absorbed photons can be moved to a base (50) and an emitter (40) due to an energy band bent in the entire region of the photoelectric conversion device. Thus, light efficiency can be improved.

The photoelectric conversion device may include homogeneous perovskite oxide, or heterogeneous perovskite oxide having lattice constants equivalent or different by about $\sqrt{2}$ times which are rotated at about 45° and joined to each other within an XY plane, in order to suppress a lattice mismatch for epitaxial growth.

Hereinafter, examples of the present disclosure will be described in more detail. However, the following examples are provided only for more easily understanding of the present disclosure, but the present disclosure is not limited thereto.

EXAMPLES

Method of Calculating Electronic Configuration

An electronic configuration of an atomic layer junction oxide suggested in the present Example was calculated using the density functional theory (DFT) code of VASP (vienna ab-initio simulation package). For simulation of the n-i-p-i structure, 2×2×10 supercells having a perovskite structure with 200 atoms and having a lattice constant of 3.904 Å were used in calculation. In this case, each of an n-type doped oxide atomic layer and a p-type doped oxide atomic layer had a thickness of 1 unit cell and each intrinsic oxide atomic layer had a thickness of 4 unit cells. The materials used in the n-i-p-i structure were formed as $La:SrTiO_3$—$SrTiO_3$—$In:SrTiO_3$—$SrTiO_3$, $La:SrTiO_3$—$SrTiO_3$—$N:SrTiO_3$—$SrTiO_3$, and $La:SrTiO_3$—$SrTiO_3$—$Sr:La\ MnO_3$—$SrTiO_3$.

A pseudopotential was calculated using the Projector Augmentaed Wave (PAW) method of the local density approximation (LDA). Some core electrons were included in a pseudopotential of a metal element in order to minimize calculation errors caused by exclusion of core electrons. Thus, pseudopotentials having 11 atoms configured as $5s^2 5_p^6 5d^1 6s^2$, 10 atoms configured as $4s^2 4p^6 5s^2$, 12 atoms configured as $^3s^2 3p^6 3d^2 4s^2$, 6 atoms configured as $2s^2 2p^4$, 13 atoms configured as $4d^{10} 5s^2 5p^1$, 5 atoms configured as $2s^2 2p^3$, and 13 atoms configured as $3p^6 3d^5 4s^2$ were used for La, Sr, Ti, O, In, N, and Mn, respectively.

$U_{eff}$ was given to d-f orbits of an element including the d-f orbits using the LDA+U method for accurate calculation in spite of a Coulomb interaction between electrons in the d-f orbits. The $U_{eff}$ values used for the LDA+U method were U−J=11−0.68 eV, 5−0.64 eV, 8−1 eV, and 8−0.88 eV for La 4f, Ti 3d, In 4d, and Mn 3d, respectively.

In case of La:SrTiO$_3$, TiO$_6$ octahedral distortion occurs depending on doping of La and is Jahn-Teller distortion in the same form as LaTiO$_3$ which is an orthorhombic crystal structure, and greatly affects electrical characteristics as well as structural characteristics. In case of LaTiO$_3$, if only the LDA method is used, a charge transfer band gap ($E_g^{CT}$) does not exist. Thus, LaTiO$_3$ has conductor characteristics and cannot reproduce insulator characteristics caused by experimentally high $E_g^{CT}$ of 4.5 eV. A configuration characteristic such as a lattice constant is not identical to an experimental value. Therefore, the LDA+U method needs to be used. In this case, if $U_{eff}$ of 5-0.64 eV is given to Ti 3d orbits using the LDA+U method, LaTiO$_3$ has $E_g^{CT}$ of 3.97 eV and thus can reproduce insulator characteristics. Further, a C-axis lattice constant having a significant effect to geometric characteristics such as Jahn-Teller distortion of orthorhombic LaTiO$_3$ crystal was 7.899 Å similar to an experimental value of 7.901 Å [Journal of the Korean Physical Society, 49, 1536 (2006)]. Thus, the $U_{eff}$ of 5-0.64 eV was given to Ti 3d orbits. Further, if only the LDA method is used, the La 4f orbit is located at a position higher by just about 2 eV than a Fermi potential unlike the experimental value, and, thus, overlapped with a lowermost end of a conduction band including the Ti 3d orbit. Thus, $U_{eff}$ of 11-0.88 eV was given to the La 4f, and like the experimental value, the La 4f was moved to a higher potential than the Ti 3d orbit [Physical Review Letters, 97, 056802 (2006), Physical Review B, 83, 193106 (2011)].

A 4×4×1 Monkhorst-pack lattice was used as a K-point lattice. An electronic configuration was calculated using cut-off energy of 500 eV.

Figure 2:
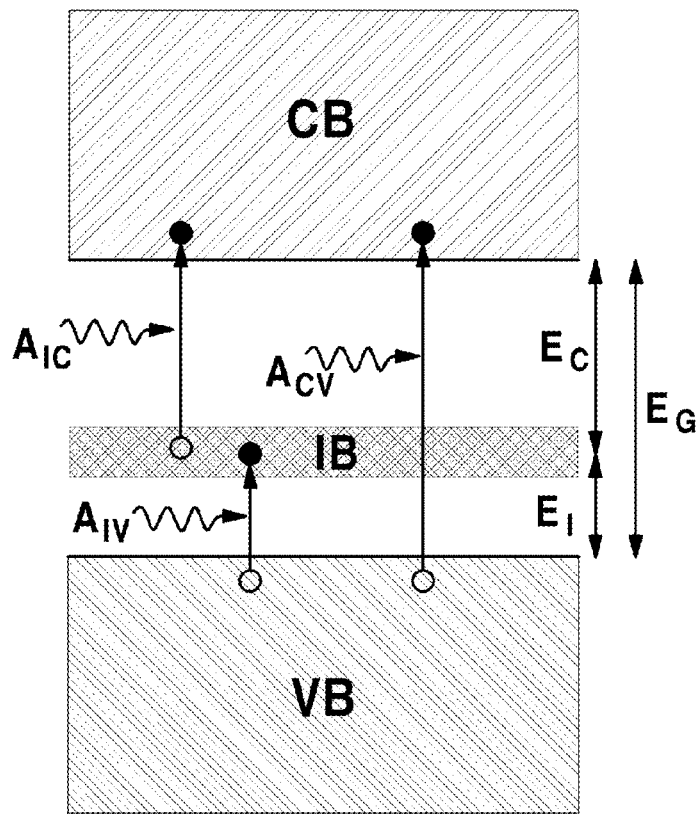
FIG. 2 is a schematic diagram illustrating a photon absorption process through an intermediate band in accordance with an example of the present disclosure.

FIG. 2 is a schematic diagram illustrating a photo absorption process through an intermediate band. As illustrated in FIG. 2, an electron in a valence band transition from the valence band to the intermediate band and from the intermediate band to a conduction band through the illustrated intermediate band even in response to a light having lower energy than a band gap. Thus, a light having lower energy than a band gap can be used for transition of an electron. Therefore, it can be seen that a wavelength range of light to be absorbed is increased and a greater amount of sunlight can be used.

Confirmation of Electric Field Formed on Atomic Layer Junction Oxide

Figure 4A:
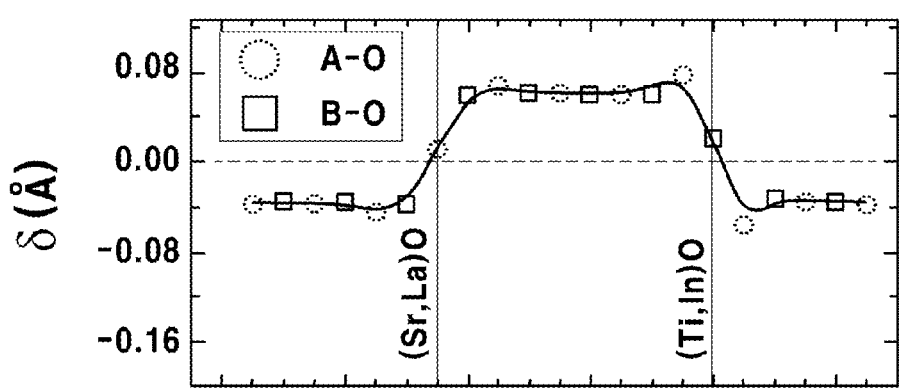
FIG. 4A to FIG. 4C are graphs showing changes in the band length of a metal ion and oxygen by an n-type doped atomic layer oxide and a p-type doped atomic layer oxide for the structure illustrated in FIG. 3A to FIG. 3C in accordance with an example of the present disclosure.
Figure 4B:
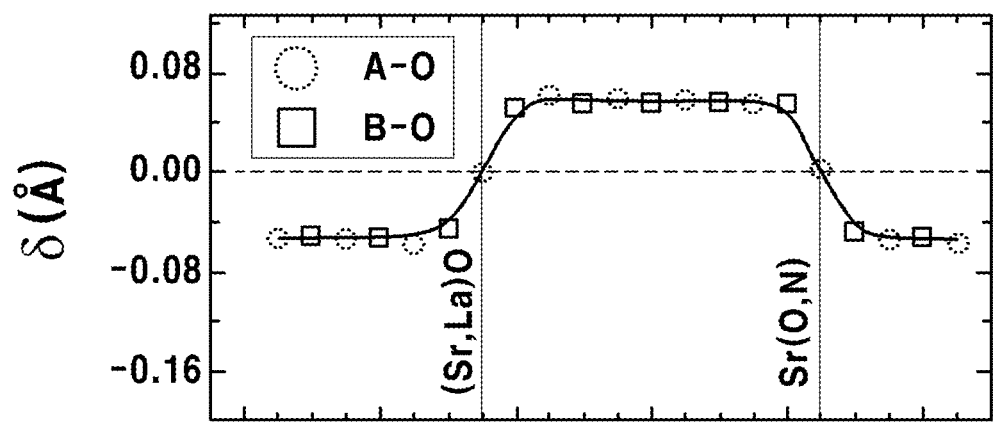
Figure 4C:
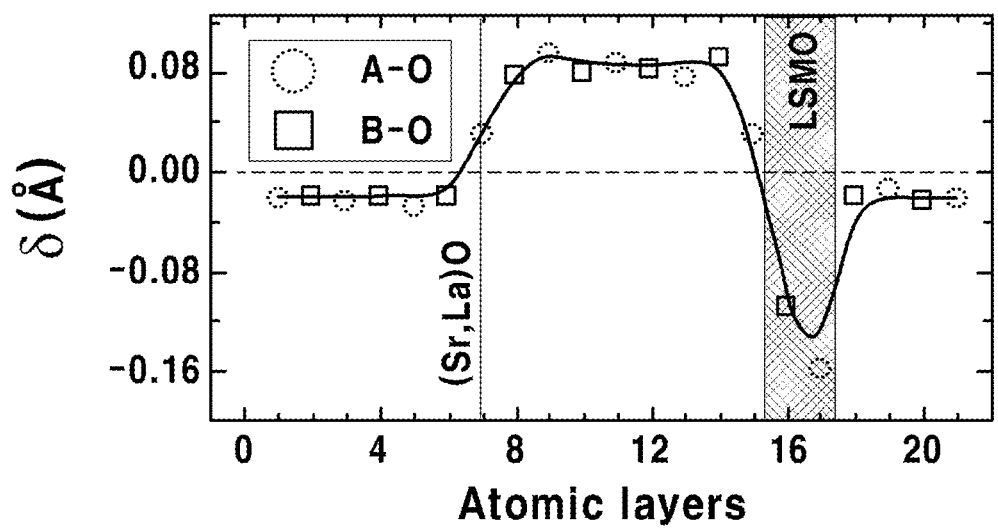

Location changes of ions with respect to a normal line direction of a junction for generating a dipole moment in an n-i-p-i artificial superlattice-based photo diode structure using La:SrTiO$_3$—SrTiO$_3$—In:SrTiO$_3$—SrTiO$_3$, La:SrTiO$_3$—SrTiO$_3$—N:SrTiO$_3$—SrTiO$_3$, and La:SrTiO$_3$—SrTiO$_3$—Sr:LaMnO$_3$—SrTiO$_3$ were as shown in FIG. 4A to FIG. 4C. In FIG. 4A to FIG. 4C, δ denotes a location variation in a normal line direction caused by ion doping on an AO plane and a BO$_2$ plane in an ABO$_3$ perovskite structure. Referring to FIG. 4A to FIG. 4C, locations of ions in intrinsic oxide atomic layers corresponding to $8^{th}$ to $15^{th}$ atomic layers between an n-type doped oxide atomic layer and a p-type doped oxide atomic layer in an n-i-p-i structure increased in a Z-axis direction and the ions were moved toward the p-type doped oxide atomic layer. Further, locations of ions in intrinsic oxide atomic layers corresponding to $1^{st}$ to $6^{th}$ atomic layers and $18^{th}$ and $20^{th}$ atomic layers between the p-type doped oxide atomic layer and the n-type doped oxide atomic layer decreased in the Z-axis direction and the ions were moved toward the p-type doped oxide atomic layer. Thus, it was confirmed that a dipole moment is generated in a direction in which an electric field generated by a charged film of a doping layer is offset.

Confirmation of Real-Space Energy Band Diagram of Atomic Layer Junction Oxide

Figure 3A:
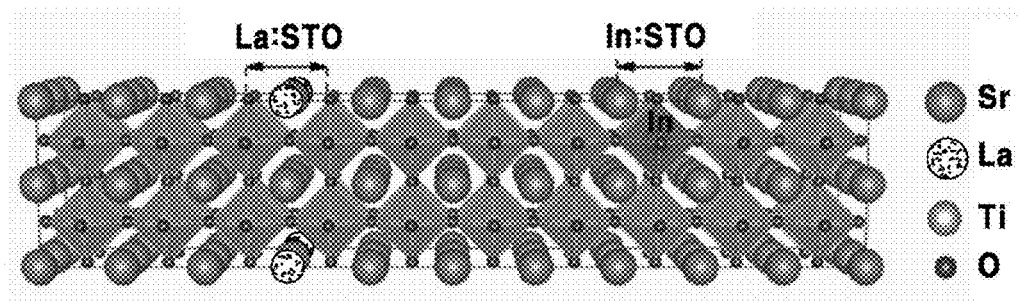
FIG. 3A to FIG. 3C are side cross-sectional view of an atomic layer junction oxide in accordance with an example of the present disclosure.
Figure 3B:
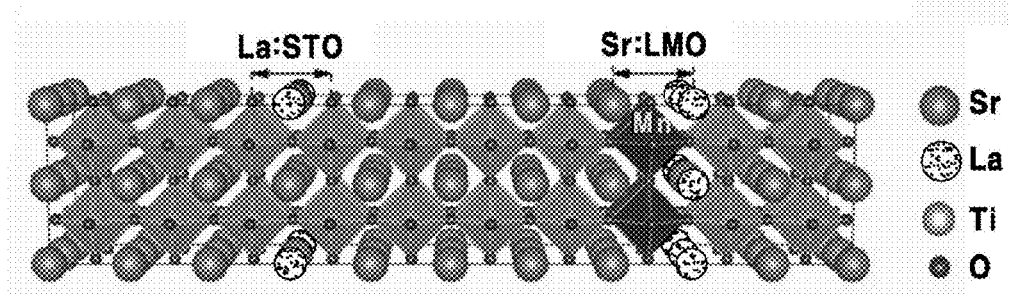
Figure 3C:
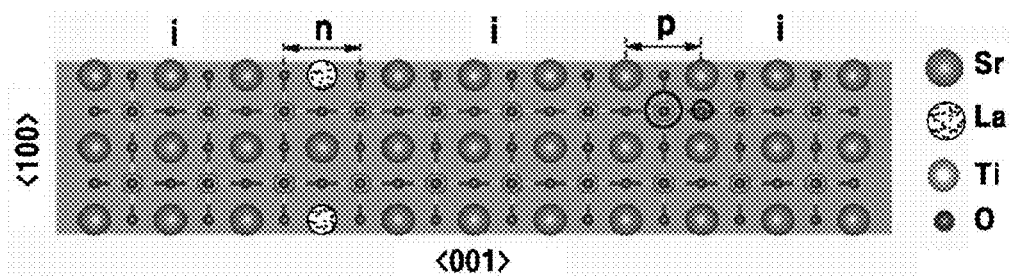
Figure 5A:
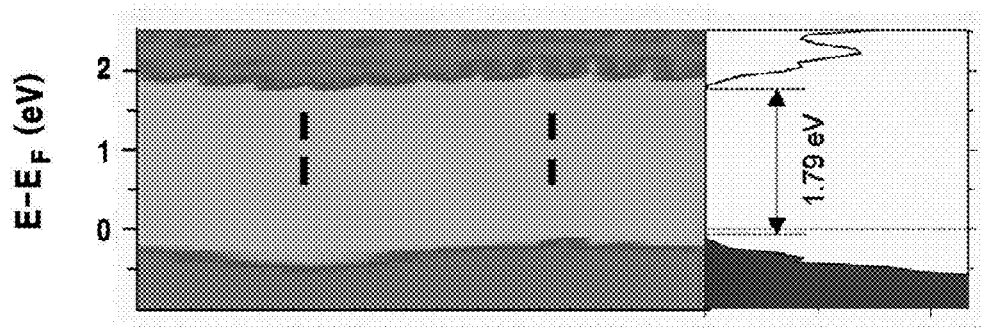
FIG. 5A to FIG. 5C are real-space energy band diagrams and state density graphs of the structure illustrated in FIG. 3A to FIG. 3C in accordance with an example of the present disclosure, and specifically.
Figure 5B:
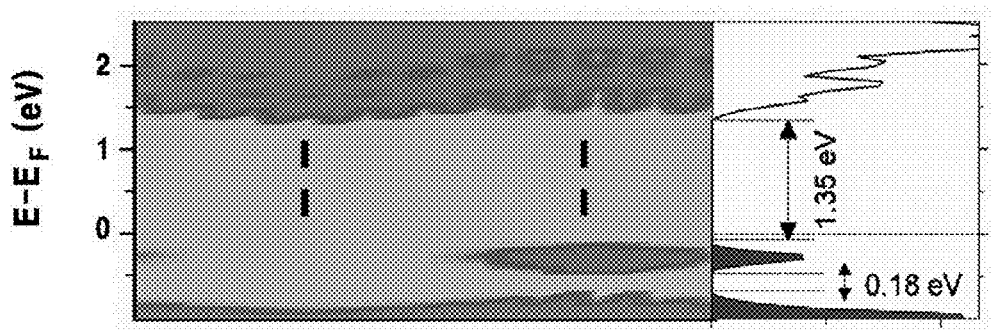
Figure 5C:
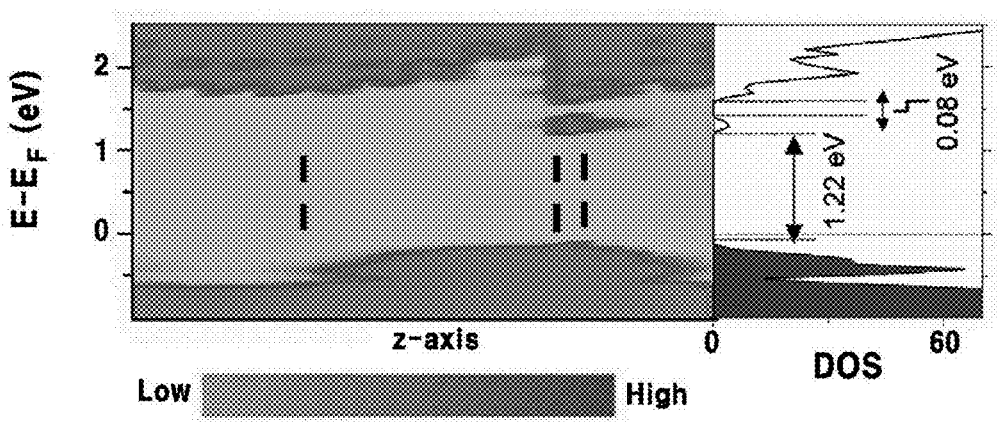

FIG. 3A to FIG. 3C are side cross-sectional view of the atomic layer junction oxide. A location variation in a normal line direction of ions caused by the n-type doped oxide atomic layer and the p-type doped oxide atomic layer with respect to the side cross-sectional structure illustrated in FIG. 3A to FIG. 3C can be seen from FIG. 4A to FIG. 4C. FIG. 5A to FIG. 5C are real-space energy band diagrams and state density graphs of an n-i-p-i artificial superlattice-based photo diode structure using La:SrTiO$_3$—SrTiO$_3$—In:SrTiO$_3$—SrTiO$_3$, La:SrTiO$_3$—SrTiO$_3$—N:SrTiO$_3$—SrTiO$_3$, and La:SrTiO$_3$—SrTiO$_3$—Sr:LaMnO$_3$—SrTiO$_3$ obtained by the first principle's calculations. In FIG. 5A to FIG. 5C, E-E$_F$ denotes the alignment of energy potentials relative to a Fermi potential as a reference value (0 eV), and DOS denotes an electron state density and uses state/eV as a unit. It was observed that a valence band and a conduction band were affected by an electric field generated in the artificial superlattice and a potential difference was made between doped layers, and, thus, an energy band was bent. Further, it was observed that the energy band was bent due to an atomic layer multijunction and thus an effective band gap was modulated. The potential difference varied depending on the kind of the p-type doped atomic layer oxide. A valence band modulation ($V_{VB}$) and a conduction band modulation ($V_{CB}$) as energy band modulation caused by formation of the n-i-p-i artificial superlattice, a maximum open circuit voltage ($V_{OC, max}$) on the basis of an effective band gap value calculated accordingly, and a corrected maximum open circuit voltage ($V'_{OC, max}$) obtained by correcting a band gap of an intrinsic oxide layer to an experimental value 3.25 eV were as shown in the following Table 1. As shown in Table 1, it was confirmed that the n-i-p-i artificial superlattice-based photo diode using La:SrTiO$_3$—SrTiO$_3$—Sr:LaMnO$_3$—SrTiO$_3$ with high valence band modulation and conduction band modulation has the lowest open circuit voltage and thus has the smallest effective gap band. The relationship of the valence band modulation and the conduction band modulation with the maximum open circuit voltage was as shown in the following Equation 1.

TABLE 1

| p-type oxide | $V_{VB}$ (eV) | $V_{CB}$ (eV) | $V_{OC, max}$ (eV) | $V'_{OC, max}$ (eV) |
|---|---|---|---|---|
| In:SrTiO$_3$ | 0.25 | 0.15 | 1.79 | 3.10 |
| N:SrTiO$_3$ | 0.23 | 0.14 | 1.91 | 3.12 |
| Sr:LaMnO$_3$ | 0.47 | 0.46 | 1.58 | 2.84 |

$$V'_{OC,max} = E_{giatrick} - (V_{VB} + V_{CB})/2 = 3.25 - (V_{VB} + V_{CB})/2 \quad (1)$$

According to the real-space energy band diagrams illustrated in FIG. 5A to FIG. 5C obtained by the first principle's calculations, it was conformed that an energy band is bent in the entire region of the n-i-p-i structure regardless of the kind of the p-type doped atomic layer oxide. This occurred in a two-dimensional atomic layer having a unit thickness of less than 5 unit cells. In the entire region of the n-i-p-i structure, electron and hole were separated and collected. An intermediate band was observed in the real-space energy band diagrams illustrated in FIG. 5B and FIG. 5C. The intermediate band appeared in the intrinsic atomic layer oxide region in contact with the n-type doped atomic layer oxide or the p-type doped atomic layer oxide. It was confirmed that the intermediate band was generated at a junction having a two-dimensional atomic layer-level thickness and when the p-type doped atomic layer oxide was used, a difference between an upper end of the valence band and a lower end of the intermediate band was 0.18 eV and a difference between an upper end of the intermediate band and a lower end of the conduction band was 1.35 eV. Further, it was confirmed that when the p-type doped atomic layer oxide was used, a difference between an upper end of the valence band and a lower end of the intermediate band was 1.22 eV and a difference between an upper end of the intermediate band and a lower end of the conduction band was 0.08 eV, and, thus, when the corresponding light energy was converted from vacuum to a wavelength, lights having long wavelengths of 15,498 nm or less and 6,888 nm or less were absorbed according to the relationship represented as $$\lambda(nm) = \frac{1239.842 \ (eV/nm)}{E(eV)}.$$

Thus, lights can be absorbed efficiently in the whole wavelength range of sunlight.

Confirmation of Electron State Density of Atomic Layer Junction Oxide

Figure 6A:
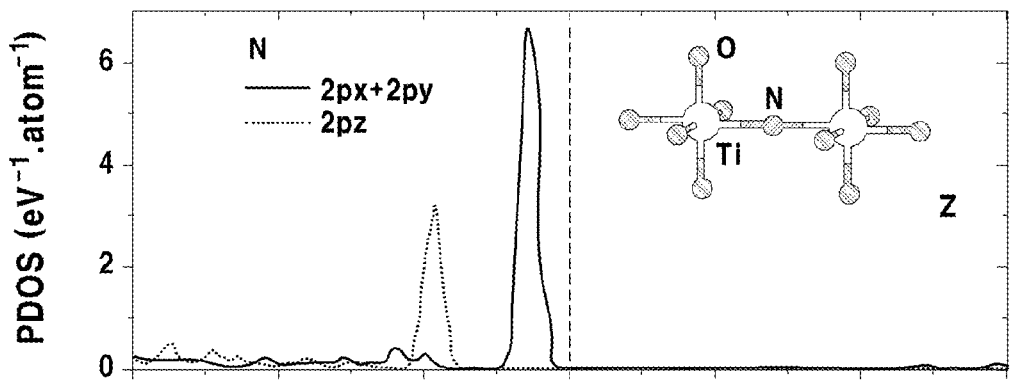
Figure 6B:
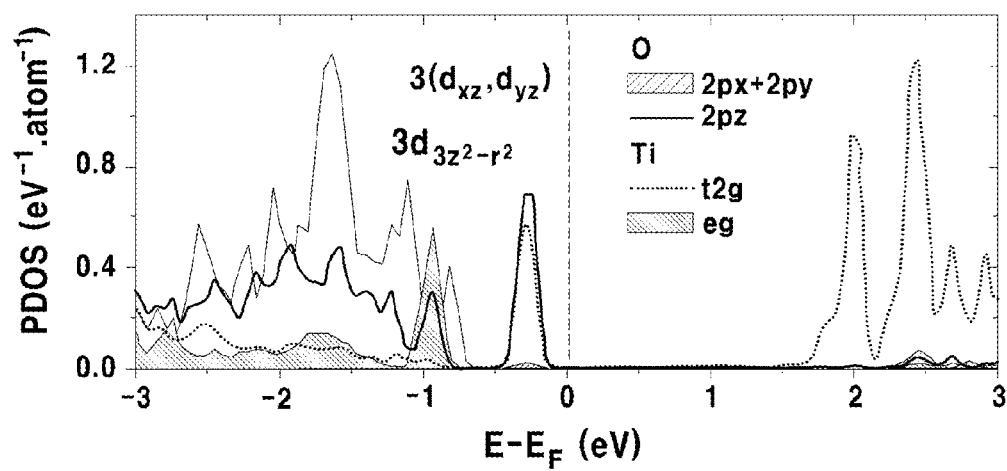
Figure 7A:
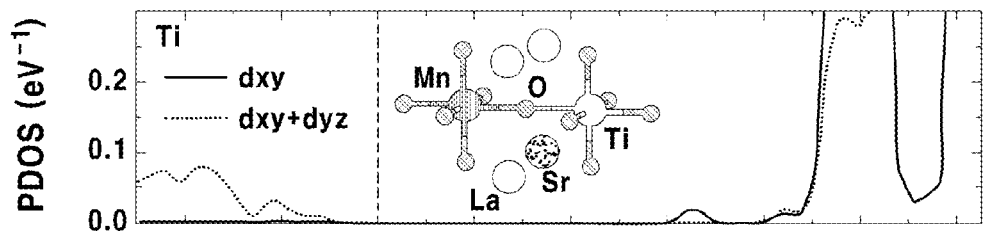
FIG. 7A to FIG. 7D are graphs showing a local electron state density of a layer of the p-type doped atomic layer oxide with respect to FIG. 5C in accordance with an example of the present disclosure.
Figure 7B:
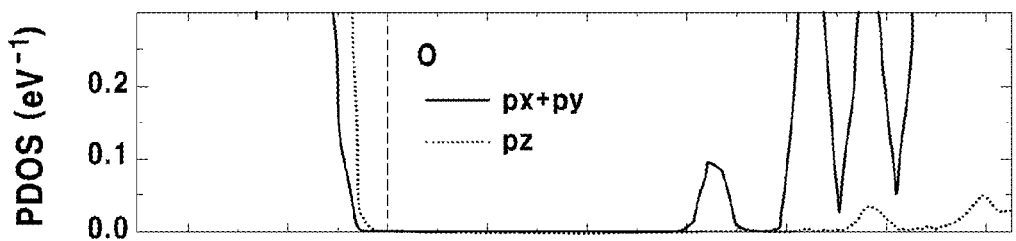
Figure 7C:
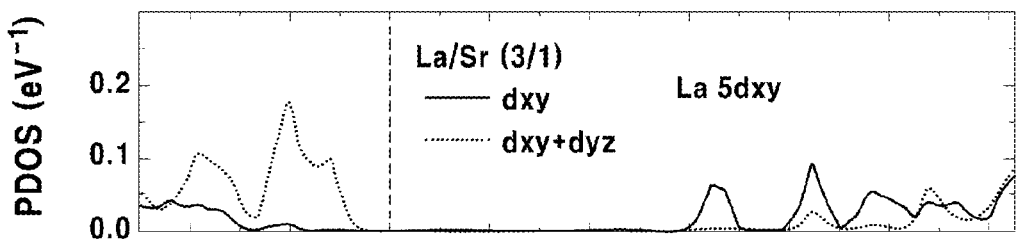
Figure 7D:
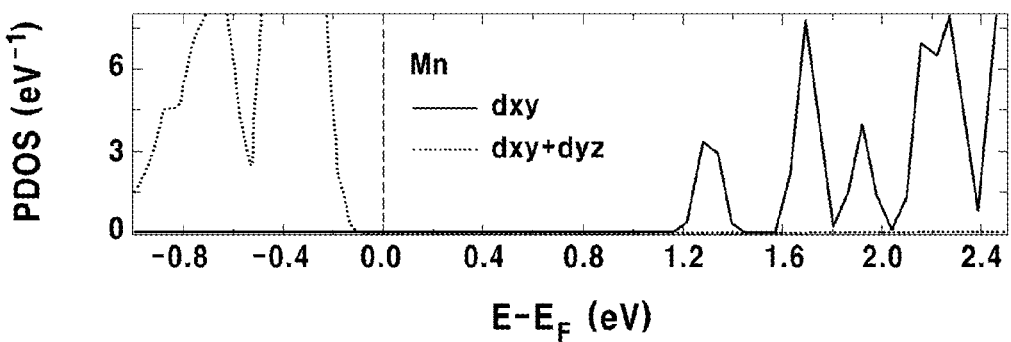

FIG. 6A and FIG. 6B show a local electron state density of a layer of a p-type doped atomic layer oxide of an n-i-p-i artificial superlattice-based photo diode using La:SrTiO$_3$—SrTiO$_3$—N:SrTiO$_3$—SrTiO$_3$ in which an intermediate band appeared as illustrated in FIG. 5B. In FIG. 6A and FIG. 6B similar to FIG. 5A to FIG. 5C, E-E$_F$ denotes the alignment of energy potentials relative to a Fermi potential as a reference value (0 eV), and PDOS denotes a local electron state density of each atom or orbit and uses state/eVatom as a unit. It can be seen from FIG. 6A that the intermediate band appearing around the valence band of the p-type doped atomic layer oxide illustrated in FIG. 5B is mainly caused by a plane-direction 2p orbit of N serving as an acceptor. It can be seen from FIG. 6B that a vertical-direction Ti 3d orbit forming a covalent band with N and a vertical-direction O 2p orbit also contribute to the intermediate band but less affect the intermediate band than the plane-direction 2p orbit of N. FIG. 7A to FIG. 7D show a local electron state density of a layer of a p-type doped atomic layer oxide of an n-i-p-i artificial superlattice-based photo diode using La:SrTiO$_3$—SrTiO$_3$—Sr:LaMnO$_3$—SrTiO$_3$ in which an intermediate band appeared as illustrated in FIG. 5C. In FIG. 7A to FIG. 7D, E-E$_F$ denotes the alignment of energy potentials relative to a Fermi potential as a reference value (0 eV), and PDOS denotes a local electron state density of each atom or orbit. Although PDOS uses state/eV atom as a unit, the first principle's calculations is used in the present disclosure and PDOS does mean an absolute value and thus uses arbitrary units. It can be seen from FIG. 7D that the intermediate band appearing around the conduction band of the p-type doped atomic layer oxide illustrated in FIG. 5C is mainly caused by a vertical-direction 3d orbit of Mn in the p-type doped layer. It can be seen from FIG. 7A to FIG. 7C that a horizontal-direction O 2p orbit and La 5d also contribute to the intermediate band but less affect the intermediate band than the vertical-direction 3d orbit of Mn.

The above description of the present disclosure is provided for the purpose of illustration, and it would be understood by those skilled in the art that various changes and modifications may be made without changing technical conception and essential features of the present disclosure. Thus, it is clear that the above-described examples are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

EXPLANATION OF CODES

10: n-type doped atomic layer oxide
20: p-type doped atomic layer oxide
30: Intrinsic atomic layer oxide
40: Emitter
50: Base

What is claimed is:

1. An atomic layer junction oxide, which is formed by alternately laminating an n-type doped atomic layer oxide; an intrinsic atomic layer oxide; a p-type doped atomic layer oxide; and an intrinsic atomic layer oxide.

2. The atomic layer junction oxide of claim 1, wherein the n-type doped atomic layer oxide includes a compound as represented by the following Chemical Formula 1;
the intrinsic atomic layer oxide includes a compound as represented by the following Chemical Formula 2; and
the p-type doped atomic layer oxide includes a compound as represented by the following Chemical Formula 3:

$n$-type doped ABO$_3$;     [Chemical Formula 1]

in Chemical Formula 1, A includes a cation of a metal selected from the group consisting of Mg, Ca, Sr, Nb, Ba, La, Eu, Gd, Pb, Bi, and combinations thereof;

B includes a cation of a metal selected from the group consisting of Al, Ti, V, Mn, Fe, Co, Ga, Zr, In, Sn, and combinations thereof; and O is a divalent anion of O ($O^{-2}$), $$A'B'O_3; \quad \text{[Chemical Formula 2]}$$

in Chemical Formula 2, A' includes a cation of a metal selected from the group consisting of Mg, Ca, Sr, Nb, Ba, La, Eu, Gd, Pb, Bi, and combinations thereof;

B' includes a cation of a metal selected from the group consisting of Al, Ti, V, Mn, Fe, Co, Ga, Zr, In, Sn, and combinations thereof; and O is a divalent anion of ($O^{-2}$), and $$p\text{-type doped } A''B''O_3; \quad \text{[Chemical Formula 3]}$$

in Chemical Formula 3, A" includes a cation of a metal selected from the group consisting of Mg, Ca, Sr, Nb, Ba, La, Eu, Gd, Pb, Bi, and combinations thereof;

B" includes a cation of a metal selected from the group consisting of Al, Ti, V, Mn, Fe, Co, Ga, Zr, In, Sn, and combinations thereof; and O includes a divalent anion of ($O^{-2}$).

3. The atomic layer junction oxide of claim 1, wherein the intrinsic atomic layer oxide includes an oxide represented as $A'^{2+}B'^{4+}O_3$ or $A'^{3+}B'^{3+}O_3$.

4. The atomic layer junction oxide of claim 1, wherein the n-type doped atomic layer oxide includes:
   a compound obtained from an oxide represented as $A^{2+}B^{4+}O_3$ by substituting a part of $A^{2+}$ with a trivalent metal cation or a part of $B^{4+}$ with a pentavalent or hexavalent metal cation;
   a compound obtained from an oxide represented as $A^{3+}B^{3+}O_3$ by substituting a part of $B^{3+}$ with a tetravalent, pentavalent or hexavalent metal cation; or
   a compound obtained from an oxide represented as $A^{2+}B^{4+}O_3$ or $A^{3+}B^{3+}O_3$ by substituting a part of $O^{2-}$ with a monovalent anion.

5. The atomic layer junction oxide of claim 1, wherein the p-type doped atomic layer oxide includes:
   a compound obtained from an oxide represented as $A''^{2+}B'''^{4+}O_3$ by substituting a part of $A''^{2+}$ with a monovalent metal cation or a part of $B'''^{4+}$ with a trivalent metal cation;
   a compound obtained from an oxide represented as $A''^{3+}B'''^{3+}O_3$ by substituting a part of $A''^{3+}$ with a monovalent or bivalent metal cation or a part of $B'''^{3+}$ with a tetravalent metal cation; or
   a compound obtained from an oxide represented as $A''^{2+}B'''^{4+}O_3$ or $A''^{3+}B'''^{3+}O_3$ by substituting a part of $O^{2-}$ with a trivalent or tetravalent anion.

6. The atomic layer junction oxide of claim 1, wherein the n-type doped atomic layer oxide and the p-type doped atomic layer oxide have the same thickness.

7. The atomic layer junction oxide of claim 1, wherein the atomic layer junction oxide is formed by alternately laminating the n-type doped atomic layer oxide, the intrinsic atomic layer oxide, the p-type doped atomic layer oxide, and the intrinsic atomic layer oxide by 10 times or less.

8. A photoelectric conversion device comprising:
   an atomic layer junction oxide according to claim 1, which is formed by alternately laminating an n-type doped atomic layer oxide; an intrinsic atomic layer oxide; a p-type doped atomic layer oxide; and an intrinsic atomic layer oxide;
   a base formed by contact with the n-type doped atomic layer oxide, the intrinsic atomic layer oxide, the p-type doped atomic layer oxide, and the intrinsic atomic layer oxide; and
   an emitter formed to face the base.

9. A method of preparing an atomic layer junction oxide, comprising alternately performing the steps of:
   forming an n-type doped atomic layer oxide on a substrate;
   forming an intrinsic atomic layer oxide on the n-type doped atomic layer oxide;
   forming a p-type doped atomic layer oxide on the intrinsic atomic layer oxide; and
   forming an intrinsic atomic layer oxide on the p-type doped atomic layer oxide.

10. The method of preparing an atomic layer junction oxide of claim 9, wherein the forming of the n-type doped atomic layer oxide includes laminating an intrinsic atomic layer oxide and n-doping the intrinsic atomic layer oxide.

11. The method of preparing an atomic layer junction oxide of claim 9, wherein the forming of the p-type doped atomic layer oxide includes laminating an intrinsic atomic layer oxide and p-doping the intrinsic atomic layer oxide.

12. The method of preparing an atomic layer junction oxide of claim 9, wherein the intrinsic atomic layer oxide includes an oxide represented as $A'^{2}B'^{4+}O_3$ or $A'^{3+}B'^{3+}O_3$.

13. The method of preparing an atomic layer junction oxide of claim 9, wherein the n-type doped atomic layer oxide includes:
   a compound obtained from an oxide represented as $A^{2+}B^{4+}O_3$ by substituting a part of $A^{2+}$ with a trivalent metal cation or a part of $B^{4+}$ with a pentavalent or hexavalent metal cation;
   a compound obtained from an oxide represented as $A^{3+}B^{3+}O_3$ by substituting a part of $B^{3+}$ with a tetravalent, pentavalent or hexavalent metal cation; or
   a compound obtained from an oxide represented as $A^{2+}B^{4+}O_3$ or $A^{3+}B^{3+}O_3$ by substituting a part of $O^{2-}$ with a monovalent anion.

14. The method of preparing an atomic layer junction oxide of claim 9, wherein the p-type doped atomic layer oxide includes:
   a compound obtained from an oxide represented as $A''^{2+}B'''^{4+}O_3$ by substituting a part of $A''^{2+}$ with a monovalent metal cation or a part of $B'''^{4+}$ with a trivalent metal cation;
   a compound obtained from an oxide represented as $A''^{3+}B'''^{3+}O_3$ by substituting a part of $A''^{3+}$ with a monovalent or bivalent metal cation or a part of $B'''^{3+}$ with a tetravalent metal cation; or
   a compound obtained from an oxide represented as $A''^{2+}B'''^{4+}O_3$ or $A''^{3+}B'''^{3+}O_3$ by substituting a part of $O^{2-}$ with a trivalent or tetravalent anion.

15. The method of preparing an atomic layer junction oxide of claim 9, wherein the n-type doped atomic layer oxide and the p-type doped atomic layer oxide have the same thickness.

* * * * *